United States Patent [19]
Mitra et al.

[11] Patent Number: 5,661,730
[45] Date of Patent: Aug. 26, 1997

[54] SAME STATE AND OPPOSITE STATE DIAGNOSTIC TEST FOR FERROELECTRIC MEMORIES

[75] Inventors: Sanjay Mitra; Holden Hackbarth, both of Colorado Springs, Colo.

[73] Assignee: Ramtron International Corporation, Colorado Springs, Colo.

[21] Appl. No.: 723,935

[22] Filed: Sep. 27, 1996

[51] Int. Cl.$^6$ .................................................. G11C 7/00
[52] U.S. Cl. ......................................... 371/21.3; 365/201
[58] Field of Search ............................ 371/21.1, 21.2, 371/21.3, 21.4; 365/201, 145; 275/295; 324/158 R

[56] References Cited

U.S. PATENT DOCUMENTS 5,337,279 8/1994 Gregory et al. .
5,457,695 10/1995 Houston ............................ 371/21.2

OTHER PUBLICATIONS

Atkin, R.B., "Performance of Sputtered $Pb_{0.92}Bi_{0.07}La_{0.01}(Fe_{0.0405}Nb_{0.325}Zr_{0.27})O_3$ Ferroelectric Memory Films," Ferroelectrics 1972, vol. 3, pp. 213–215, Norwich, England.

Sharma, B.S., et al., "Retention in Thin Ferroelectric Films," Ferroelectrics 1973, vol. 5, pp. 69–75, Norwich, England.

Mehta, R.R., et al., "Depolarization Fields in Thin Ferroelectric Films," Journal of Applied Physics, vol. 44, No. 8, Aug. 1973, pp. 3379–3385, Woodbury, New York.

Shepherd, W.H., "Fatigue and Aging in Sol–Gel Derived PZT Thin Films," Materials Research Society Symposium Proceedings vol. 200, 1990, pp. 277–289, Pittsburgh, Pennsylvania.

Abt, N., "Electrical Measurement of Ferroelectric Capacitors for Non–Volatile Memory Applications," Materials Research Society Symposium Proceedings vol. 200, 1990, pp. 303–312, Pittsburgh, Pennsylvania.

Kulkarni, J., et al., "Ageing of Volatile and Non–Volatile Components of the Remnant Polarization in PZT," Proceedings of the International Symposium on Integrated Ferroelectrics (1992), pp. 363–369, National Semiconductor Corp., Santa Clara, California.

Huffman, M., et al., "Morphology and Electrical Characterization of Calcium Modified Ferroelectric Lead Zirconate Titanate Films," Ferroelectrics, 1993, v. 143, n. 1/4, pp. 251–62, Norwich, England.

Dat, R., et al., "Imprint Testing of Ferroelectic Capacitors Used for Non–Volatile Memories," Integrated Ferroelectrics, 1994, vol. 5, pp. 275–286, Amsterdam B.V.

Evans, J.T. Jr., et al., "The Imprint Mechanism in Ferroelectric Capacitors," Proceedings of the International Symposium on Integrated Ferroelectrics (1995), Radiant Technologies, Inc., Albuquerque, New Mexico.

Lee, J., et al., "Imprint of $(Pb,La)(Zr,Ti)O_3$ Thin Films With Various Crystalline Qualities," Applied Physics Letter, vol. 68, No. 4, Jan. 22, 1996, Woodbury, New York.

Traynor, S.D., et al., "Capacitor Test Simulation of Retention and Imprint Characteristics for Ferroelectric Memory Operation," International Symposium on Integrated Ferroelectrics, Mar. 18–20, 1996, Phoenix, Arizona.

*Primary Examiner*—Vincent P. Canney
*Attorney, Agent, or Firm*—Peter J. Meza

[57] ABSTRACT

A test method for ferroelectric memories includes the steps of: functionally testing the ferroelectric memories to determine functional yield; storing the ferroelectric memories for at least eight hours; writing an initial pattern into the ferroelectric memories; baking the ferroelectric memories; reading the initial pattern to determine same state yield; writing an inverse pattern into the ferroelectric memories; reading the inverse pattern to determine opposite state yield; and again writing the initial pattern into the ferroelectric memories. The steps of baking, reading the initial pattern and writing the inverse pattern, and reading the inverse pattern and writing the initial pattern are repeated for a number of test cycles. The ferroelectric memories are baked at a temperature of about 150° C. for a predetermined duration that is incremented with each successive test cycle.

20 Claims, 6 Drawing Sheets

SAME STATE AND OPPOSITE STATE DIAGNOSTIC TEST FOR FERROELECTRIC MEMORIES

BACKGROUND OF THE INVENTION

This invention relates generally to ferroelectric memories. More particularly, the present invention relates to a wafer-level diagnostic test for characterizing the performance of integrated circuit ferroelectric memories.

A method of testing ferroelectric capacitors is set forth in an article entitled "Capacitor Test Simulation of Retention and Imprint Characteristics for Ferroelectric Memory Operation" presented at the ISIF conference, Mar. 18–20, 1996 in Phoenix, Ariz., and in co-pending patent application Ser. No. 08/616,913 assigned to the present assignee, Ramtron International Corporation, entitled "A method of Measuring Retention Performance and Imprint Degradation of Ferroelectric Films", both of which are hereby incorporated by reference.

In the above-referenced article and patent application, the test method disclosed therein measures same state and opposite state charge, which is extremely useful in characterizing the electrical performance of ferroelectric capacitors and films. However, ferroelectric capacitor and film performance is not necessarily correlated to integrated circuit ferroelectric memory performance. The results of this test cannot, therefore, be relied upon to accurately predict the behavior of a ferroelectric memory at wafer level. This is due to the myriad of other factors affecting performance related to the design of the memory and the semiconductor processing steps used in fabricating the memory, as well as other factors. Each of these factors can affect memory performance either directly or by interacting with the underlying ferroelectric capacitor performance.

What is desired, therefore, is a comprehensive diagnostic test for evaluating and characterizing the electrical performance of integrated circuit ferroelectric memories.

SUMMARY OF THE INVENTION

It is, therefore, a principal object of the test method of the present invention to characterize the performance of integrated ferroelectric memories, particularly at wafer level.

It is another object of the test method of the present invention to characterize both the same state and opposite state performance of a ferroelectric memory.

It is an advantage of the test method of the present invention that testing time is kept to a minimum.

It is another advantage of the test method of the present invention that it can be used to characterize all aspects of a ferroelectric memory including ferroelectric material composition, memory design, and integrated circuit process flow.

It is yet another advantage of the test method of the present invention that memory performance may be evaluated prior to the expense and effort of assembly at package level.

According to the present invention a test method for ferroelectric memories includes the steps of: functionally testing the ferroelectric memories to determine functional yield; storing the ferroelectric memories for at least eight hours; writing an initial pattern into the ferroelectric memories; baking the ferroelectric memories; reading the initial pattern to determine same state yield; writing an inverse pattern into the ferroelectric memories; reading the inverse pattern to determine opposite state yield; and again writing the initial pattern into the ferroelectric memories. The steps of baking, reading the initial pattern and writing the inverse pattern, and reading the inverse pattern and writing the initial pattern are repeated for a plurality of test cycles.

Any pattern may be used initially to write to the ferroelectric memories. For example, a "checkerboard" pattern of logic ones and zeroes, a pattern of alternating rows of logic ones and logic zeroes, a pattern of alternating columns of logic ones and logic zeroes, or an entire field of either logic ones or zeroes may be initially written into the ferroelectric memories. The inverse pattern is simply the logical inverse of the initial pattern. For example an initial pattern of all logic zeroes would require an inverse pattern of all logic ones.

The ferroelectric memories are baked at a temperature of about 150° C. for a predetermined duration that is incremented with each successive test cycle. For example, an initial duration for the baking time of about two hours is used during a first test cycle. A cumulative duration for the baking time of about twelve hours is used during a second test cycle. Cumulative bake times of about forty-eight hours and 120 hours are used during the third and fourth test cycles. Other cumulative bake times, bake temperatures, and further testing cycles can be used as desired.

To minimize testing time, both reading/writing steps are performed in succession on each ferroelectric memory before the same reading/writing step is performed on the next ferroelectric memory. The technique also ensures that the delay between the first and second reading/writing steps is the same for each ferroelectric memory, since ferroelectric memory retention performance is dependent upon the delay time and temperature.

The "same state fallout" or yield loss due to same state related failures is calculated after the first test cycle by dividing the same state yield by the functional yield. The same state fallout after the second and subsequent test cycles is calculated by dividing the same state yield, modified to remove prior same state failures, by the original functional yield. The "same state fallout rate" can be calculated by plotting the same state fallout versus cumulative bake time. The "opposite state fallout" or yield loss due to opposite state related failures is calculated by dividing the opposite state yield by the original functional yield after each test cycle. The "opposite state fallout rate" can be calculated by plotting the opposite state fallout versus cumulative bake time. Both the same state and opposite state fallouts and fallout rates can be used to fully characterize the performance of ferroelectric memories.

The foregoing and other objects, features and advantages of the invention will become more readily apparent from the following detailed description of a preferred test flow of the present invention which proceeds with reference to the accompanying drawings.

DETAILED DESCRIPTION

Figure 5:
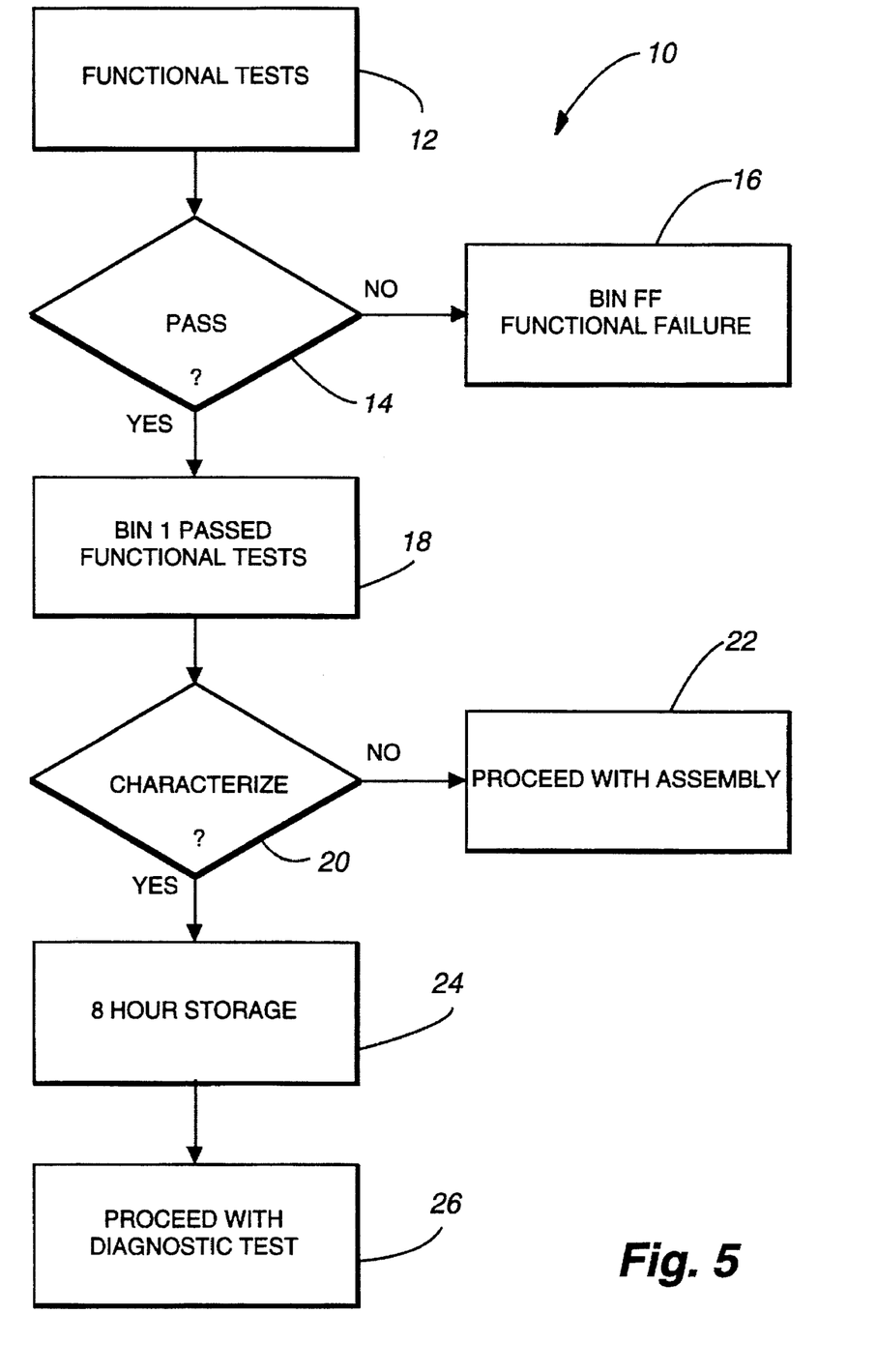
FIG. 5 is a block diagram of a functional test performed prior to continuing with a diagnostic test according to the test method of the present invention.

Referring now to FIG. 5, a block diagram 10 of a functional test performed prior to continuing with a diagnostic test according to the test method of the present invention is shown. Block or step 12 represents the standard functional tests in the production probe flow that are conducted across a ferroelectric memory wafer. Standard functional tests can include tests for leakage current, bit failures, memory speed, and the like according to a desired operating specification. If the memory at a given probe location fails any of the required functional tests at decision block 14, it is "binned" as a functional failure (bin FF) at block 16 and the probe location is recorded. If desired, the specific type of functional failure may be noted rather than simply noting a functional failure. If the memory at a given probe location passed all of the required functional tests at decision block 14 it is binned as passing (Bin 1) at block 18 at the probe location is also recorded.

At decision block 20, a decision can be made either to assemble the memories or to further characterize the memories using the test method of the present invention. This is an important decision, because further characterization according to the test method of the present invention places additional stress on the memories making them unsuitable for assembly and sale. If further characterization is not desired, the wafer can be assembled into commercially viable ferroelectric memories at block 22. If further characterization is desired, the wafer is stored for a reasonable time, such as eight hours, at block 24 before the diagnostic test according to the present invention is begun at block 26.

Figure 1A:
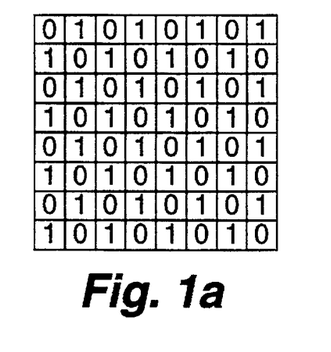
FIGS. 1(a) and 1(b) are diagrams of the contents of a ferroelectric memory array showing an initial checkerboard example pattern and an inverse checkerboard pattern.
Figure 1B:
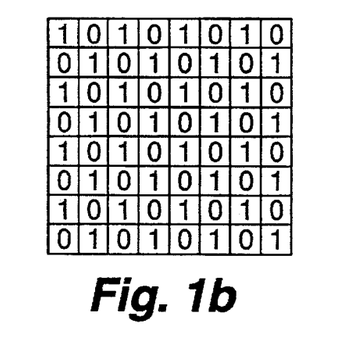
Figure 2A:
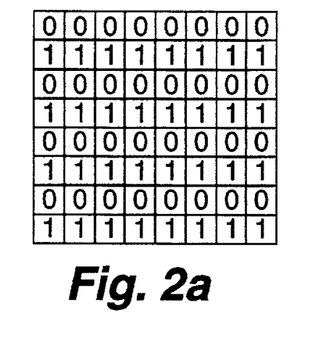
FIGS. 2(a) and 2(b) are diagrams of the contents of a ferroelectric memory array showing an initial alternating row example pattern and an inverse alternating row pattern.
Figure 2B:
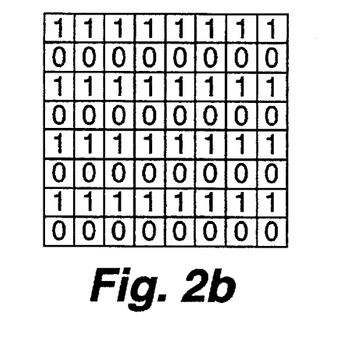
Figure 3A:
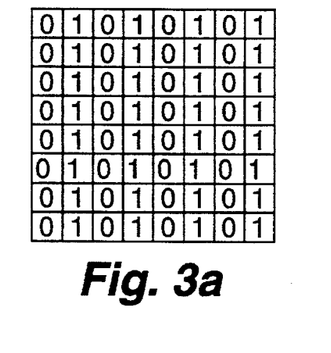
FIGS. 3(a) and 3(b) are diagrams of the contents of a ferroelectric memory array showing an initial alternating column example pattern and an inverse alternating column pattern.
Figure 3B:
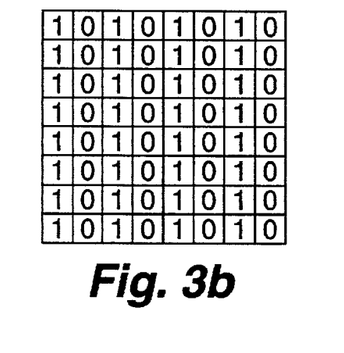
Figure 4A:
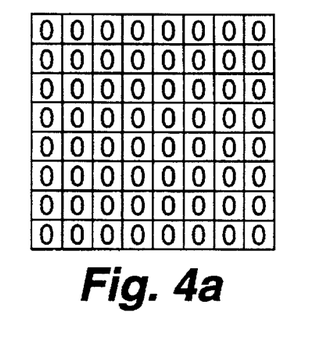
FIGS. 4(a) and 4(b) are diagrams of the contents of a ferroelectric memory array showing an initial field example pattern of all logic zeroes and an inverse field pattern of all logic ones.
Figure 4B:
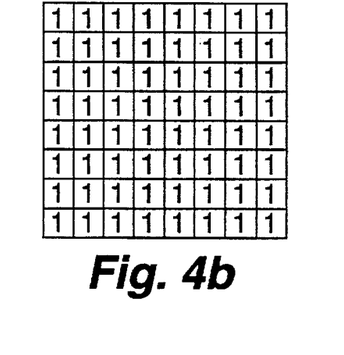
Figure 6:
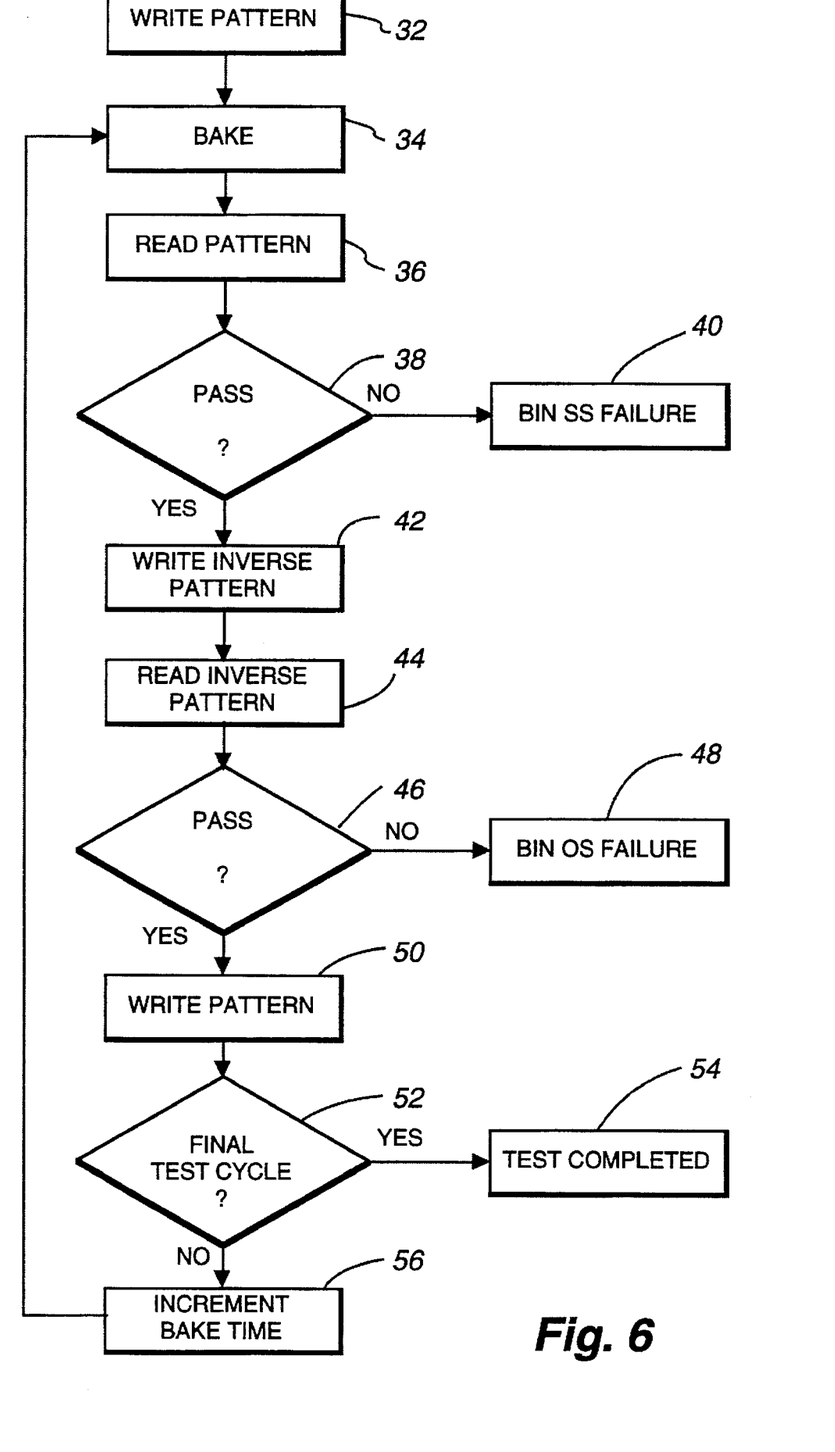
FIG. 6 is a block diagram of the diagnostic test according to the test method of the present invention, which allows data to be collected related to both same state-related and opposite state-related memory failures.

Referring now to FIG. 6, a block diagram 30 of the diagnostic test according to the test method of the present invention, which allows data to be collected related to both same state-related and opposite state-related memory failures, is shown. At block 32 a predetermined initial pattern is written into each memory on the wafer. Any pattern may be used, but some convenient example patterns that can be used in the present diagnostic test are shown in FIGS. 1(a) and 1(b) through FIGS. 4(a) and 4(b). FIGS. 1(a) and 1(b) are diagrams of the contents of a ferroelectric memory array showing an initial checkerboard pattern of logic ones and zeroes and an inverse checkerboard pattern of logic ones and zeroes. Although the array shown is only a representative array having a memory capacity of eight bits by eight bits, the pattern can be extended in either direction for a larger array, such as a 16 Kbit or 256 Kbit array. FIGS. 2(a) and 2(b) are diagrams of the contents of a ferroelectric memory array showing an initial alternating row pattern and an inverse alternating row pattern. FIGS. 3(a) and 3(b) are diagrams of the contents of a ferroelectric memory array showing an initial alternating column pattern and an inverse alternating column pattern. FIGS. 4(a) and 4(b) are diagrams of the contents of a ferroelectric memory array showing an initial field pattern of all logic zeroes and an inverse field pattern of all logic ones.

Referring again to FIG. 6, at block 34 the wafer is baked for two hours at a reasonable temperature during the first test cycle. The bake temperature used in the present test flow is about 150° C. The time and bake temperature are based on a PZT-based memory (lead-zirconate-titanate ferroelectric material) and both may be adjusted for other memory designs, other ferroelectric materials, or as desired for any other test requirement.

At block 36 the "same state" pattern (the one baked into the memories on the wafer) is read. Ideally, only the functional memories previously identified are read. A wafer map can be constructed in which the functional die locations are specified and can be used to guide the wafer tester. The results of the read operation control the test flow at decision block 38. If the memory fails the same state read operation, it is binned as a same state failure (Bin SS Failure) and its location recorded. If the memory passes the same state read operation, the inverse pattern (opposite state) is written to the memory at step 42. The opposite state pattern is the logical inverse of the initial pattern and it is not baked into the wafer. It is important to note that the reading step 36 and writing step 42 are ideally performed at the same die location. In other words, the probe tester does not move to the next die location until both the reading step 36 and the writing step 42 are performed in succession. Once both steps are performed, the probe tester moves to the next functional die location and the memory at that location is tested in the same manner. At the end of the "first pass probe", the whole wafer has been read for same state (step 36) and written for opposite state (step 42). The time to accomplish the "first pass probe" is also the opposite state delay time.

During the "second pass probe", the probe tester automatically steps back to the first die location and reads the inverse pattern (opposite state) and writes back the initial pattern (same state). At block 44 the "opposite state" pattern (the inverse pattern not baked into the memories on the wafer) is read. Ideally, only the functional memories previously identified are read. The results of the read operation control the test flow at decision block 46. If the memory fails the opposite state read operation, it is binned as an opposite state failure (Bin OS Failure) and its location recorded. If the memory passes the opposite state read operation, the initial pattern (same state) is re-written to the memory at step 50. Again, it is important to note that the reading step 44 and writing step 50 are ideally performed at the same die location. In other words, the probe tester does not move to the next die location until both the reading step 44 and the writing step 50 are performed in succession. Once both steps are performed, the probe tester moves to the next functional die location and the memory at that location is tested in the same manner. At the end of the second pass probe, the whole wafer has been read for opposite state (step 44) and re-written for same state (step 42).

It is important that the test flow be conducted as state above, because opposite state performance is a time and temperature-related phenomenon. Therefore, it is important that each die location experience about the same amount of time (as well as the same temperature or temperature difference) between the first pass probe and the second pass probe. The test flow described above ensures that each die location experiences substantially the same time delay between the same state test and the opposite state test, as well as between bake cycles.

The wafer is then baked for additional times as desired at about 150° C. or other desired baking temperature and the testing steps described above are repeated. At decision block 52, the number of testing cycles controls the test flow. If the final test cycle has been reached, the test is complete at block 54 and the wafer is fully characterized. If the final test cycle is not reached, the baking time is incremented at block 56 and the test repeated starting with baking step 34. In the preferred test flow, the baking step 34 has a duration of about two hours during a first test cycle, a cumulative duration of about twelve hours during a second test cycle, a cumulative duration of about forty-eight hours during a third test cycle, and a cumulative duration of about 120 hours during a fourth test cycle. Of course, these initial and cumulative baking times and baking temperatures can be altered as desired, especially if a non-PZT ferroelectric memories are tested or if additional data points are desired.

Figure 7A:
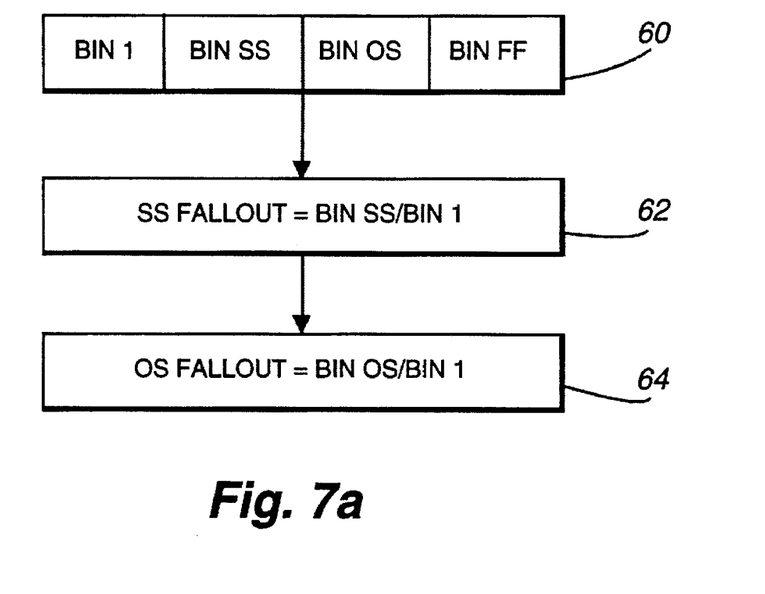
FIG. 7(a) is a block diagram of the data manipulation process required to calculate same state and opposite state fallout after the first test cycle.

Turning now to FIG. 7(a) a block diagram of the data manipulation process required to calculate same state and opposite state fallout after the first test cycle is shown. Block 60 shows the ferroelectric memories binned according to the passing or failure of the functional tests, or the first test cycle same state and first test cycle opposite state tests. Bin 1 refers to the memories that have passed the functional tests. Bin SS refers to the memories that have failed the same state test. Bin OS refers to the memories that have failed the opposite state test. Bin FF refers to the memories that have failed the functional tests. Additional bins can be used to further classify the specific type of functional test failed. The same state fallout is calculated after the first test cycle at step 62 by dividing the same state yield by the functional yield, i.e.

$$SS \text{ Fallout} = \text{Bin } SS/\text{Bin } 1. \qquad \text{Eq. [1]}$$

Similarly, the opposite state fallout is calculated after the first test cycle at step 64 by dividing the opposite state yield by the functional yield, i.e.

$$OS \text{ Fallout} = \text{Bin } OS/\text{Bin } 1. \qquad \text{Eq. [2]}$$

Figure 7B:
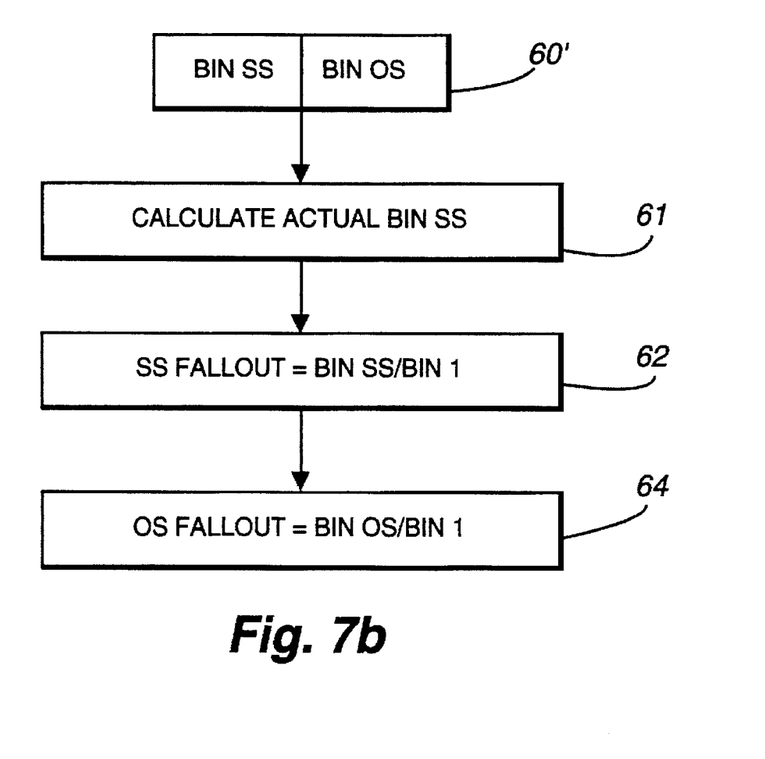
FIG. 7(b) is a block diagram of the data manipulation process required to calculate same state and opposite state fallout after the second and subsequent test cycles.

Turning now to FIG. 7(b) a block diagram of the data manipulation process required to calculate same state and opposite state fallout after the second and subsequent test cycles is shown. Block 60' shows the ferroelectric memories binned according to the passing or failure of only the same state and opposite state tests on the second and subsequent test cycles. Bin 1 is not recalculated, but refers to the memories that have passed all the original functional tests and this number is used in all subsequent same state and opposite state fallout calculations. Bin SS refers to the memories that have failed the same state test on the second or subsequent test cycles, so there may be a different Bin SS number for each test cycle. Bin OS refers to the memories that have failed the opposite state test on the second or subsequent test cycles, so again, there may be a different Bin OS number for each test cycle. The same state fallout after the second and subsequent test cycles is calculated at blocks 61 and 62 by dividing the same state yield, modified to remove prior same state and opposite state failures, by the functional yield. Therefore, to find the true number of same state failures, the Bin SS count must be decremented by the number of Bin SS and Bin OS failures found in the previous test cycle or cycles. The reason this must be done is that the memories that have failed the same state and opposite state tests in the prior test cycle are now compromised and will therefore again fail the current same state test. To avoid double counting of failures, they must be subtracted out of the total count. Once the Bin SS count has been corrected, the same state fallout is calculated according to equation [1] given above. The opposite state fallout doe not have to be corrected, because opposite state failures will be new or "true" opposite state failures. The opposite state fallout is calculated according to equation [2] given above at block 64.

Once the same state fallout has been calculated, a same state fallout rate can be easily determined by plotting the same state fallout or the cumulative same state fallout versus cumulative bake time. Similarly, once the opposite sate fallout has been calculated, an opposite state fallout rate can be easily determined by plotting the opposite state fallout or the cumulative opposite state fallout versus cumulative bake time. The resultant graphs in which fallout rate is plotted against cumulative bake time form the basis of analyzing the underlying performance of any aspect of the ferroelectric memory population being tested, especially memory retention and reliability performance. Although the plotting of cumulative same state and opposite state fallout is shown and described below, it will be appreciated by those skilled in the art that the instantaneous yield can be plotted at any read point and will provide useful diagnostic data.

Figure 8A:
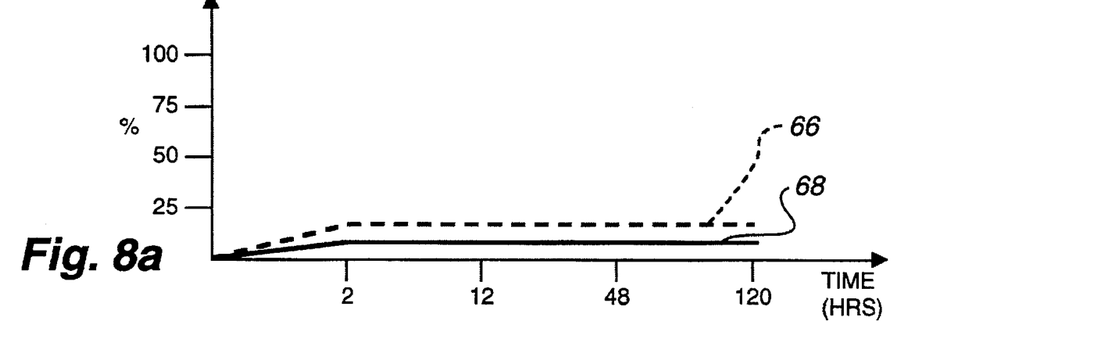
FIG. 8(a) is a plot of a hypothetical ferroelectric memory population having both a low same state and a low opposite state fallout rate.

In FIG. 8(a) a plot of hypothetical ferroelectric memory population having both a low same state fallout rate 66 and a low opposite state fallout rate 68 is shown. A cumulative failure rate of less than 25% is shown for both same state and opposite state performance at a cumulative bake time of 120 hours.

Figure 8B:
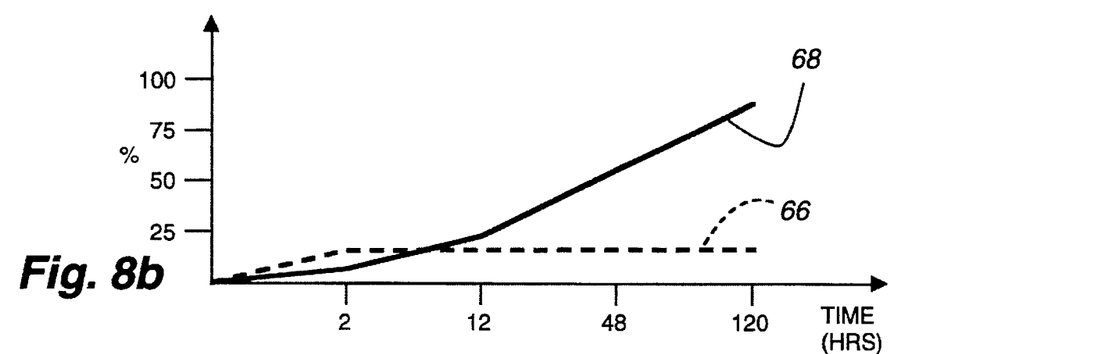
FIG. 8(b) is a plot of a hypothetical ferroelectric memory population having a flow same state and a high opposite state fallout rate.

In FIG. 8(b) a plot of a hypothetical ferroelectric memory population having a low same state fallout rate 66 and a high opposite state fallout rate 68 is shown. The hypothetical population has a cumulative same state failure rate 66 of less than 25%, but has a cumulative opposite state failure rate 68 approaching 100%.

Figure 8C:
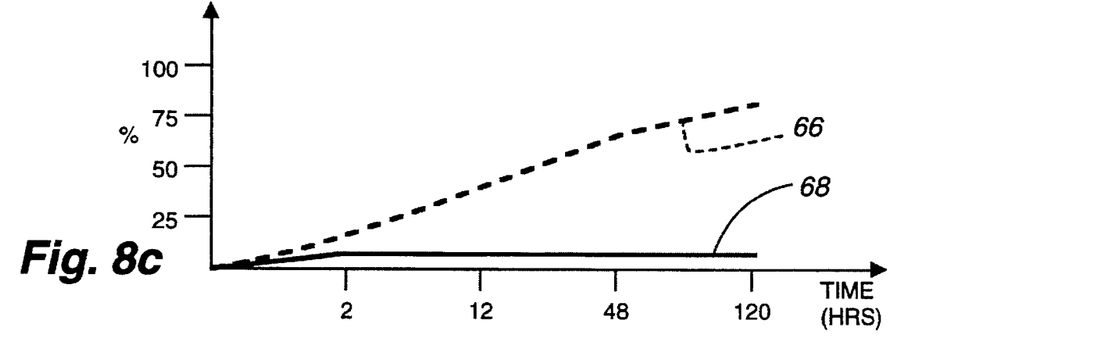
FIG. 8(c) is a plot of a hypothetical ferroelectric memory population having a high same state and a low opposite state fallout rate.

In FIG. 8(c) a plot of a hypothetical ferroelectric memory population having a high same state fallout rate 66 and a low opposite state fallout rate 68 is shown. The hypothetical population has a cumulative same state failure rate 66 approaching 100%, but has a cumulative opposite state failure rate 68 of less than 25%.

Figure 8D:
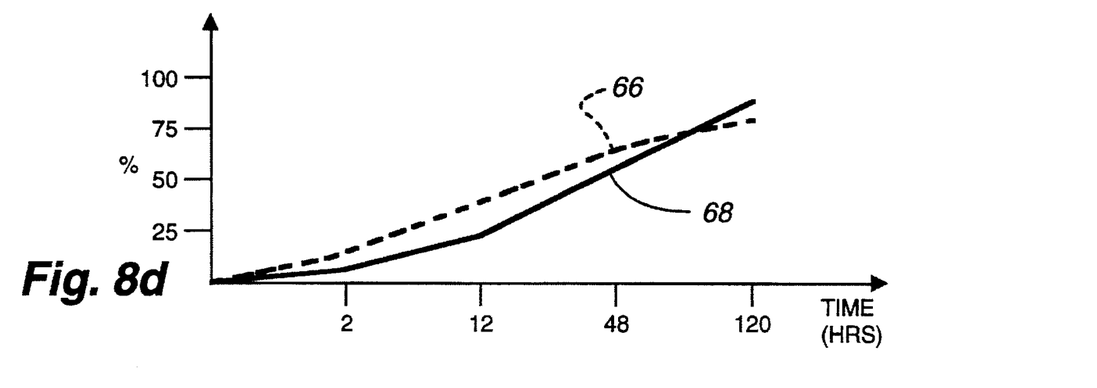
FIG. 8(d) is a plot of a hypothetical ferroelectric memory population having both a high same state and a high opposite state fallout rate.

In FIG. 8(d) a plot of a hypothetical ferroelectric memory population having both a high same state fallout rate 66 and a high opposite state fallout rate 68 is shown. A cumulative failure rate approaching 100% is shown for both same state and opposite state performance at a cumulative bake time of 120 hours.

In characterizing the performance of ferroelectric memories, it is important that both the same state and opposite state performance be plotted. A change in material composition, design, a processing step or any other change may not affect same state performance, for example, but may have a profound effect on opposite state performance, or vice versa. Once a base line performance standard has been plotted as shown in FIGS. 8(a–8(d), any aspect of the ferroelectric memory may be changed and the subsequent performance compared to the base line performance. The diagnostic test therein described is not limited to changes directly affecting ferroelectric capacitor performance, but can also include those changes only indirectly affecting ferroelectric capacitor performance. Changes made in the fabrication process having no affect on ferroelectric memory performance can also be confirmed using an A–B comparison technique as described above.

Figure 9:
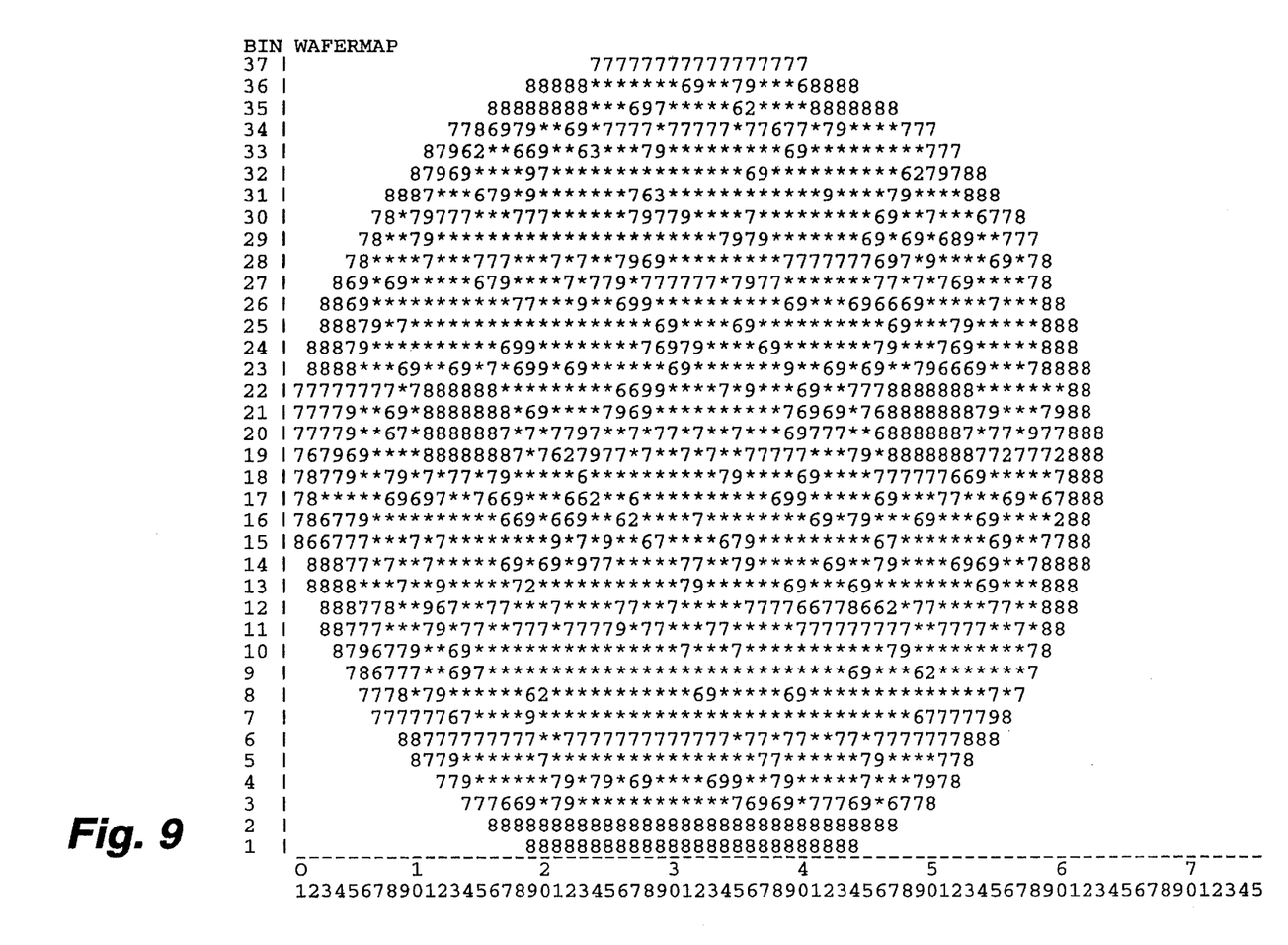
FIG. 9 is an example wafer map illustrating the locations of the functional, same state, and opposite state failures.

An example wafer map for a ferroelectric memory wafer is shown in FIG. 9. In the sample of FIG. 9, Bin 1 memories are represented by an asterisk, Bin SS failures are represented by the number 9, Bin OS failures are represented by the number 2, and Bin FF functional failures are represented by numbers 3–8. A wafer map generated from the raw test data after each testing cycle is also a useful diagnostic tool that can be used in addition to the graphical techniques shown in FIGS. 8(a)–8(d) and described above. For example, noting that all of the same state failures occur towards the center of the wafer and that all of the opposite state failures occur towards the periphery of the wafer may provide useful information to correct or refine a given step in a fabrication process flow.

In sum, a test method for ferroelectric memories includes the steps of: writing a first pattern into the ferroelectric memories; baking the ferroelectric memories; reading the first pattern and writing a second pattern into at least one of the ferroelectric memories; reading the second pattern and writing the first pattern into at least one of the ferroelectric memories; and repeating the two read/write steps for a plurality of test cycles.

Having described and illustrated the principles of the invention in a preferred test flow thereof, it is appreciated by those having skill in the art that the invention can be modified in arrangement and detail without departing from such principles. For example, the testing times, number of testing cycles and bake temperatures can be modified as desired. Additionally, the data can be manipulated in numerous other ways as desired while still conveying the nature of the same state and opposite state performance at wafer level. Still further, although greater expense will be incurred than at wafer level, the diagnostic test of the present invention can be modified to test packaged parts if desired. We therefore claim all modifications and variation coming within the spirit and scope of the following claims.

We claim:

1. A test method for ferroelectric memories comprising the steps of:

(a) functionally testing the ferroelectric memories to determine functional yield;

(b) writing an initial pattern into the ferroelectric memories;

(c) baking the ferroelectric memories;

(d) reading the initial pattern to determine same state yield;

(e) writing an inverse pattern into the ferroelectric memories;

(f) reading the inverse pattern to determine opposite state yield;

(g) writing the initial pattern into the ferroelectric memories; and (h) repeating steps (c) through (g) for a plurality of test cycles.

2. The test method of claim 1 further comprising the step of storing the ferroelectric memories for at least eight hours between steps (a) and (b).

3. The test method of claim 1 in which steps (b) and (g) comprise the step of writing a pattern of alternating rows of logic ones and logic zeros into the ferroelectric memories.

4. The test method of claim 1 in which step (c) comprises baking the ferroelectric memories at a temperature of about 150° C.

5. The test method of claim 1 further comprising the step of incrementing the duration of the baking step (c) with each successive test cycle.

6. The test method of claim 1 in which step (c) comprises baking the ferroelectric memories for a duration of about two hours during a first test cycle.

7. The test method of claim 1 in which step (c) comprises baking the ferroelectric memories for a cumulative duration of about twelve hours during a second test cycle.

8. The test method of claim 1 in which step (c) comprises baking the ferroelectric memories for a cumulative duration of about forty-eight hours during a third test cycle.

9. The test method of claim 1 in which step (c) comprises baking the ferroelectric memories for a cumulative duration of about 120 hours during a fourth test cycle.

10. The test method of claim 1 in which steps (d) and (e) are performed in succession on each ferroelectric memory.

11. The test method of claim 1 in which steps (f) and (g) are performed in succession on each ferroelectric memory.

12. The test method of claim 1 in which step (a) comprises the step of functionally testing integrated circuit ferroelectric memory die at wafer level.

13. The test method of claim 12 in which steps (d) and (e) are performed in succession on each integrated circuit ferroelectric memory die on the wafer.

14. The test method of claim 12 in which steps (f) and (g) are performed in succession on each integrated circuit ferroelectric memory die on the wafer.

15. The test method of claim 1 further comprising the steps of:

calculating a same state fallout after the first test cycle by dividing the same state yield by the functional yield; and calculating the same state fallout after the second and subsequent test cycles by dividing the same state yield, modified to remove prior same state and opposite state failures, by the functional yield.

16. The test method of claim 15 further comprising the step of calculating a same state fallout rate by plotting the same state fallout versus cumulative bake time.

17. The test method of claim 1 further comprising the step of calculating an opposite state fallout by dividing the opposite state yield by the functional yield after each test cycle.

18. The test method of claim 17 further comprising the step of calculating an opposite state fallout rate by plotting the opposite state fallout versus cumulative bake time.

19. A test method for ferroelectric memories comprising the steps of:

(a) writing a first pattern into the ferroelectric memories;

(b) baking the ferroelectric memories;

(c) reading the first pattern and writing a second pattern into at least one of the ferroelectric memories;

(d) reading the second pattern and writing the first pattern into at least one of the ferroelectric memories; and (e) repeating steps (b) through (d) for a plurality of test cycles.

20. A wafer-level test method for ferroelectric memories comprising the steps of:

(a) functionally testing each ferroelectric memory on the wafer to determine functional yield;

(b) writing an initial pattern into each ferroelectric memory on the wafer;

(c) baking the wafer at a temperature of about 150° C.;

(d) starting with an initial ferroelectric memory location on the wafer, reading the initial pattern to determine same state yield and then writing an inverse pattern into each functional ferroelectric memory on the wafer;

(e) returning to the initial ferroelectric memory location on the wafer, reading the inverse pattern to determine opposite state yield and then writing the initial pattern into each functional ferroelectric memory on the wafer;

(f) incrementing the duration of the baking step (c); and (g) repeating steps (c) through (f) for a plurality of test cycles.

* * * * *